(12) United States Patent
Lung et al.

(10) Patent No.: US 6,962,728 B2
(45) Date of Patent: Nov. 8, 2005

(54) METHOD FOR FORMING ONO TOP OXIDE IN NROM STRUCTURE

(75) Inventors: Hsian Lan Lung, Hsinchu (TW); Ching Tang Wang, Taoyuan Hsien (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 10/440,437

(22) Filed: May 16, 2003

(65) Prior Publication Data

US 2004/0228969 A1    Nov. 18, 2004

(51) Int. Cl.[7] ............................................. C23C 16/30
(52) U.S. Cl. ........................ 427/255.29; 427/255.394; 427/255.7; 427/376.2
(58) Field of Search .................... 427/255.29, 255.394, 427/376.1, 255.7, 376.2

(56) References Cited

U.S. PATENT DOCUMENTS

| | | | |
|---|---|---|---|
| 5,768,192 A | | 6/1998 | Eitan |
| 5,966,603 A | | 10/1999 | Eitan |
| 6,074,917 A | | 6/2000 | Chang et al. |
| 6,297,096 B1 | | 10/2001 | Boaz |
| 6,344,394 B1 | * | 2/2002 | Kaneoka ..................... 438/261 |
| 6,436,763 B1 | * | 8/2002 | Huang et al. ................ 438/255 |
| 6,537,881 B1 | * | 3/2003 | Rangarajan et al. ........ 438/261 |
| 6,696,351 B1 | * | 2/2004 | Kuroda ....................... 438/450 |
| 6,706,575 B2 | * | 3/2004 | Fan et al. ................... 438/197 |
| 6,737,322 B2 | * | 5/2004 | Inoue et al. ................. 438/267 |
| 6,787,417 B2 | * | 9/2004 | Inoue .......................... 438/258 |

OTHER PUBLICATIONS

Eli Lusky, Yosi Shacham-Diamand, Ilan Bloom and Boaz Eitan, Electron Discharge Model of Locally-Trapped Charge in Oxide-Nitride-Oxide (ONO) Gates for NROM Non-Volatile Semiconductor Memory Devices, Sep. 2001 pp 1-2.

Boaz Eitan, Paolo Pavan, Ilan Bloom, Efraim Laoni, Aviv Frommer, and David Finzi, Can NROM, a 2-bit, Trapping Storage NVM Cell, Give a Real Challenge to Floating Gate Cells?, 1999 pp 1-3.

Eli Lusky, Yosi Shacham-Diamand, Ilan Bloom, and Boaz Eitan, Spatial characterization of Channel hot electron injection Utilizing subthreshold slope of the localized charge storage NROM memory device, Aug. 2001 pp 1-2.

* cited by examiner

Primary Examiner—Bret Chen
(74) Attorney, Agent, or Firm—Haynes Beffel & Wolfeld LLP

(57) ABSTRACT

A method for making a silicon oxide/silicon nitride/silicon oxide structure includes forming a tunnel oxide layer and a silicon nitride layer over a substrate; annealing the silicon nitride layer; forming a silicon oxide layer over the annealed silicon nitride layer by high temperature low pressure chemical vapor deposition; depositing a first gate layer over the silicon oxide layer; patterning to form a silicon oxide/silicon nitride/silicon oxide (ONO) structure; forming bit lines in the substrate adjacent the ONO structure; and annealing to form a thermal oxide over the bit lines.

11 Claims, 5 Drawing Sheets

| Temp. | 800 | 800 | 1000 | 1000 | 1000 | 1000 | 1000 | 1000 | 800 | 800 | 800 |
|---|---|---|---|---|---|---|---|---|---|---|---|
| $N_2$ | 10 | 15 | 15 | 15 | | | | 15 | 15 | 15 | 15 |
| $O_2$ | | 0.5 | 0.5 | 0.5 | 10 | 6 | 10 | | | | |
| $H_2$ | | | | | | 10 | | | | | |
| Mode | 1 | 1 | 3 | 2 | 2 | 2 | 2 | 2 | 3 | 1 | 1 |
| Time | | I L | 5 °C | 10 ' | 5 ' | 6 ' | 5 ' | 10 ' | 3 °C | U L | END |
| Heater | | | | ON | ON | ON | ON | | | | |
| Step | 0 | 1 | 2 | 3 | 4 | 5 | 6 | 7 | 8 | 9 | |

METHOD FOR FORMING ONO TOP OXIDE IN NROM STRUCTURE

BACKGROUND

This invention relates to NROM devices, and to methods for forming the top oxide on a silicon oxide/silicon nitride/silicon oxide ("ONO") structure in NROM devices.

Conventionally in manufacture of NROM devices the top oxide of the silicon oxide/silicon nitride/silicon oxide ("ONO") structure is formed by thermal oxidation of the nitride layer.

However, in conventional processes oxidation of silicon nitride is time-consuming and has a very high thermal budget. In some conventional processes, for example, silicon nitride is oxidized by wet oxidation within a furnace at a temperature of 1000° C. over a time period as long as 60 minutes.

Moreover, the silicon nitride layer in the ONO stack must be made sufficiently thick to allow for consumption of some of the silicon nitride layer during the thermal oxidation step to form the top oxide. Moreover it can be difficult to control the uniformity and thickness of the resulting nitride layer and, accordingly, the resulting NROM cell is less reliable.

SUMMARY

According to the invention, the ONO top oxide is formed using a high temperature chemical vapor deposition process. The process of the invention has a lower thermal budget than conventional thermal oxidation processes for forming ONO top oxides, providing for an improved reliability of the resulting NROM structure.

Because the process of the invention does not consume a significant amount of the silicon nitride layer during top oxide formation, the nitride layer in the ONO stack can be made much thinner, enabling formation of thinner and smaller structure overall.

NROM devices having ONO top oxide layers formed according to the invention can provide increased data retention times, as compared with devices having ONO top oxides made using a conventional thermal oxidation process.

In one general aspect the invention features a method for making a silicon oxide/silicon nitride/silicon oxide structure, by forming a tunnel oxide layer and a silicon nitride layer over a substrate; annealing the silicon nitride layer; forming a silicon oxide layer over the annealed silicon nitride layer by high temperature low pressure chemical vapor deposition; depositing a first gate layer over the silicon oxide layer; patterning to form a silicon oxide/silicon nitride/silicon oxide (ONO) structure; forming bit lines in the substrate adjacent the ONO structure; and annealing to form a thermal oxide over the bit lines.

The bottom oxide can be formed by dry oxidation at a temperature in the range 700° C. to 900° C. using a flow of $O_2$ with $N_2$ as a carrier gas, growing the oxide to a layer thickness about 30 Å to about 100 Å.

The silicon nitride layer can be formed by chemical vapor deposition to a layer thickness about 30 Å to about 80 Å.

The silicon nitride anneal can be formed by wet oxidation at a temperature in the range 800° C. to 1000° C. using a flow of $O_2$ and $H_2$ with $N_2$ as a carrier gas.

The top oxide can be formed by high temperature low pressure chemical vapor deposition using a mixture of $N_2O$ and $SiH_2Cl_2$ as a deposition gas at a temperature about 800° C., forming the oxide to a layer thickness about 30 Å to about 150 Å.

In some embodiments the substrate is a P substrate and the bit lines are $N^+$.

DETAILED DESCRIPTION

The invention will now be described in further detail by reference to the drawings, which illustrate alternative embodiments of the invention. The drawings are diagrammatic, showing features of the invention and their relation to other features and structures, and are not made to scale. For improved clarity of presentation, in the Figs. illustrating embodiments of the invention, elements corresponding to elements shown in other drawings are not all particularly renumbered, although they are all readily identifiable in all the Figs.

Figure 1:
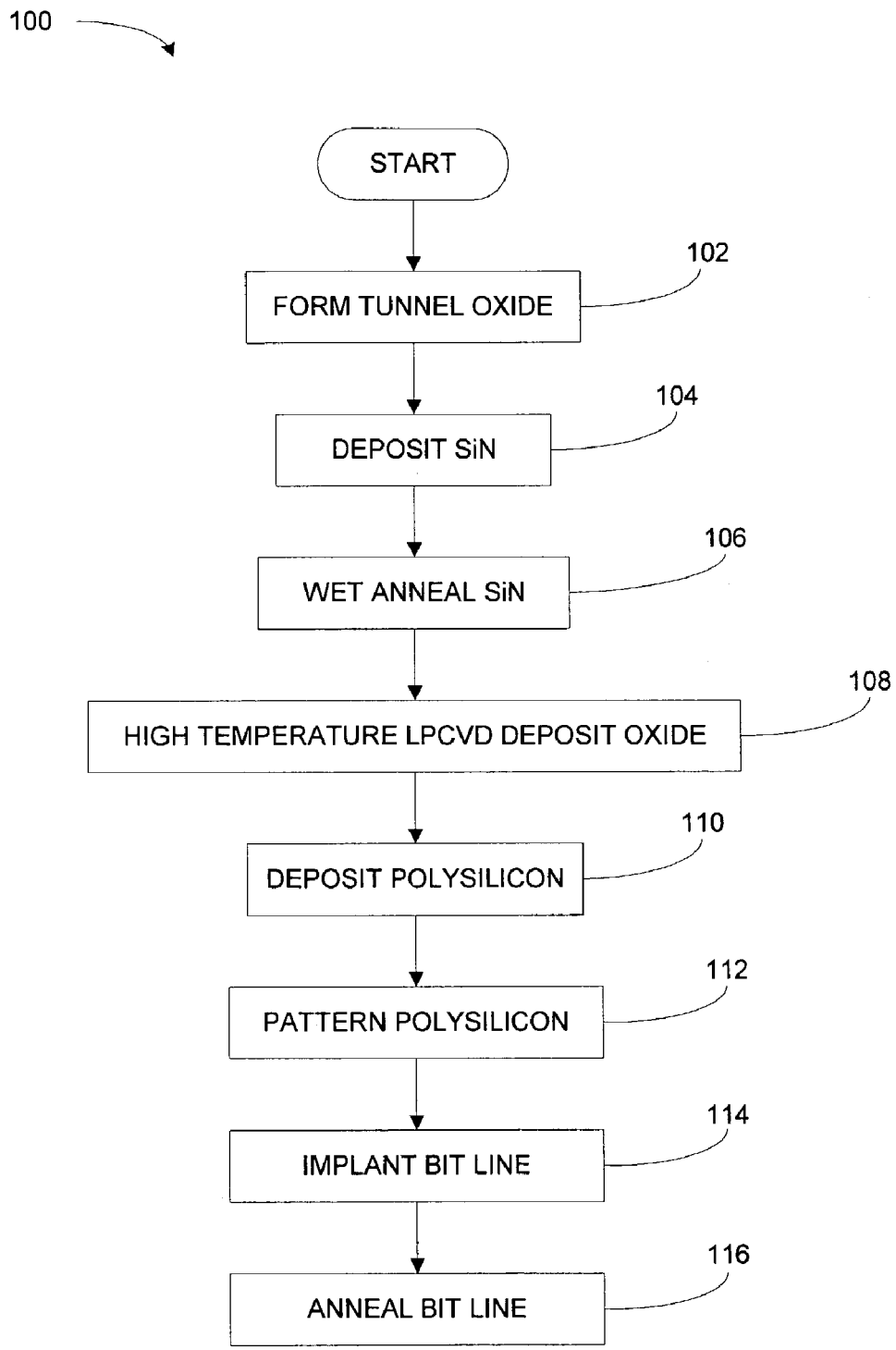
FIG. 1 is a flow diagram showing steps in a process according to an embodiment of the invention.
Figure 2A:
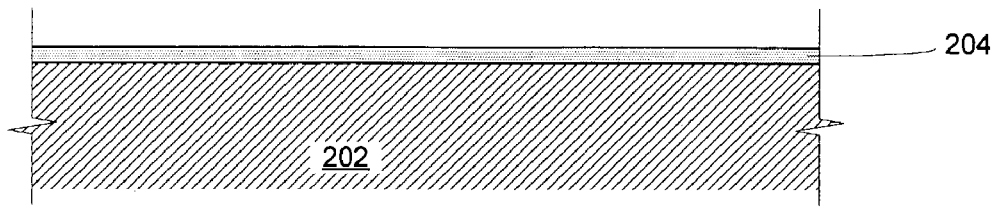
FIGS. 2A through 2H are diagrammatic sketches in a sectional view showing stages in a process according to the invention as in FIG. 1.
Figure 2B:
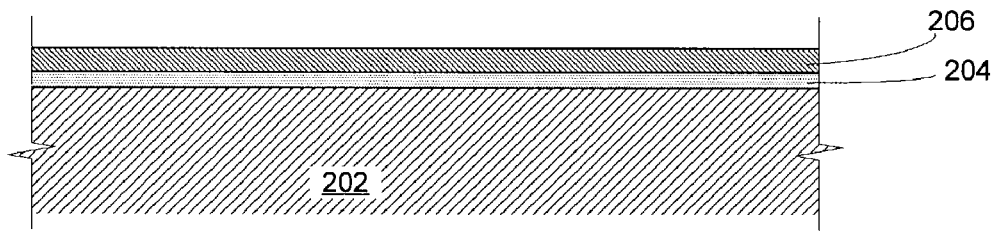
Figure 2C:
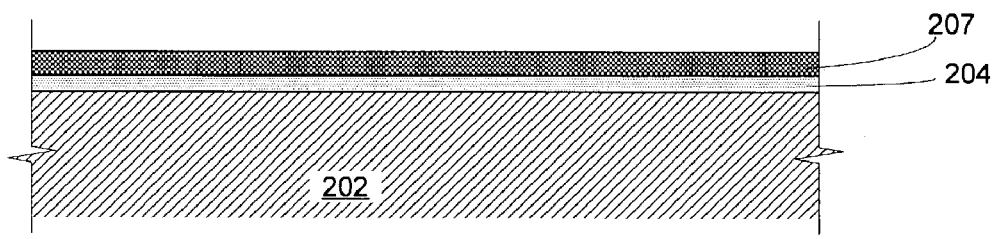
Figure 2D:
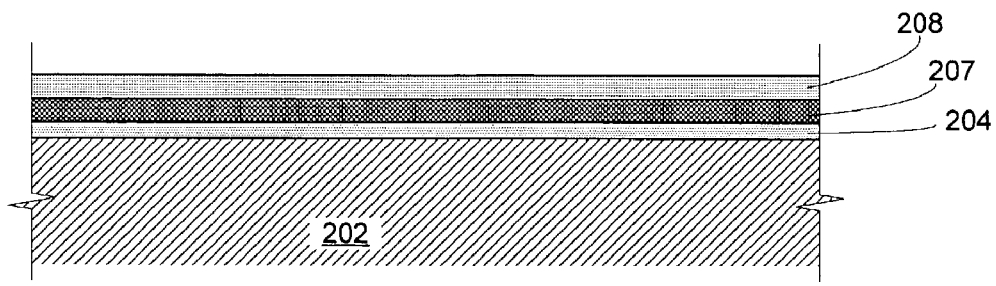
Figure 2E:
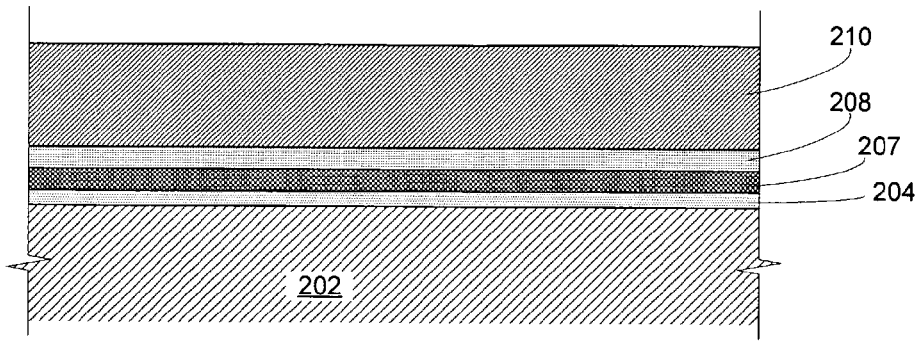
Figure 2F:
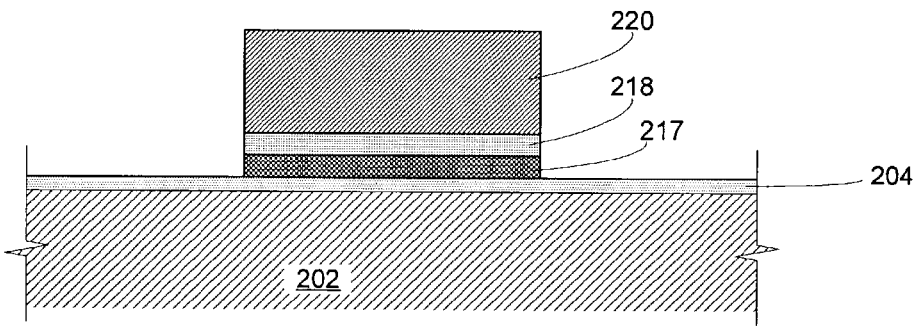
Figure 2G:
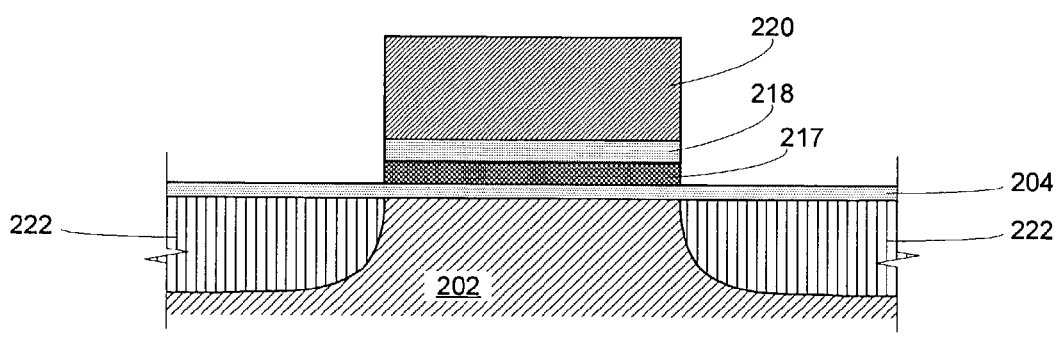
Figure 2H:
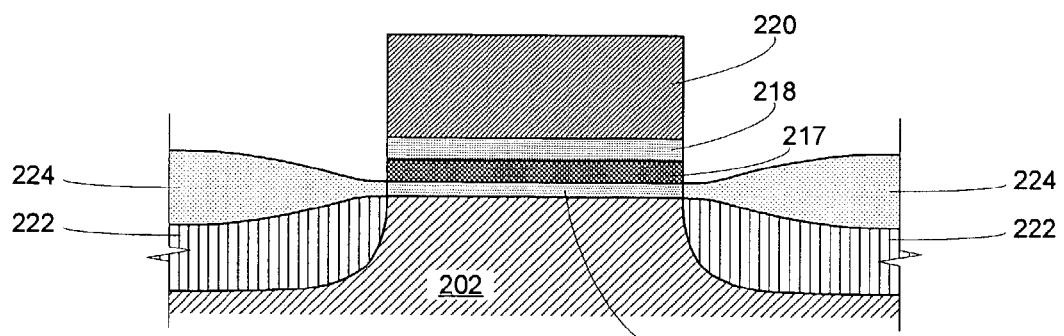

Referring now to FIG. 1, a flow diagram is shown of a process 100 for forming a top oxide on an ONO structure in a NROM device. Resulting structures at various stages in the process are shown in diagrammatic sectional views in FIGS. 2A through 2H. In a step 102, a first oxide layer 204 (to constitute a tunnel oxide in the completed device) is formed on a surface of a substrate 202 such as a silicon wafer (FIG. 2A). The first oxide layer is formed to a thickness in the range about 30 Å to about 100 Å. Preferably the first oxide layer is formed by a dry oxidation process, described in more detail below. In a step 104, a silicon nitride layer 206 is formed on the first oxide layer 204 (FIG. 2B). The silicon nitride layer is formed to a thickness in the range about 30 Å to about 80 Å. Preferably the silicon nitride layer is formed using a low pressure chemical vapor deposition, described in more detail below. In a step 106, the silicon nitride layer 206 is subjected to a wet anneal process to form an annealed silicon nitride layer 207 over the first oxide layer 204 (FIG. 2C). A preferred wet anneal process is described in more detail below. In a step 108, a high temperature low pressure chemical vapor deposition process is employed to deposit a second oxide layer 208 over the annealed silicon nitride layer 207 (FIG. 2D). The second oxide layer is formed to a thickness in the range about 50 Å to about 150 Å. A high temperature LPCVD ("Low Pressure Chemical Vapor Deposition") process for forming the top oxide layer is described in more detail below. This completes the formation of a silicon oxide/silicon nitride/silicon oxide ("ONO") film. In a step 110, a polysilicon layer 210 is deposited over the second oxide layer 208. In a step 112, the polysilicon layer 210 and the second oxide layer 208 and the silicon nitride layer 207 of the ONO film are patterned and etched to define an ONO stack, including the tunnel oxide 204, the patterned silicon nitride 217, and the top oxide 218, overlain by polysilicon gate 220. In a step 114, an ion implant is carried out to form bit lines 222 in the substrate 202 adjacent the ONO stack. Usually, the substrate constitutes a P-well, and in such instances the bit lines are N+, formed by implant of, for example, arsenic ions. In a step 116, an anneal process is carried out to form a thick oxide 224 over the bit lines, leaving a portion of the tunnel oxide layer 204 beneath the patterned silicon nitride 217 to constitute the bottom oxide 214 of the ONO structure and to complete the NROM device.

Figures 3, 4:
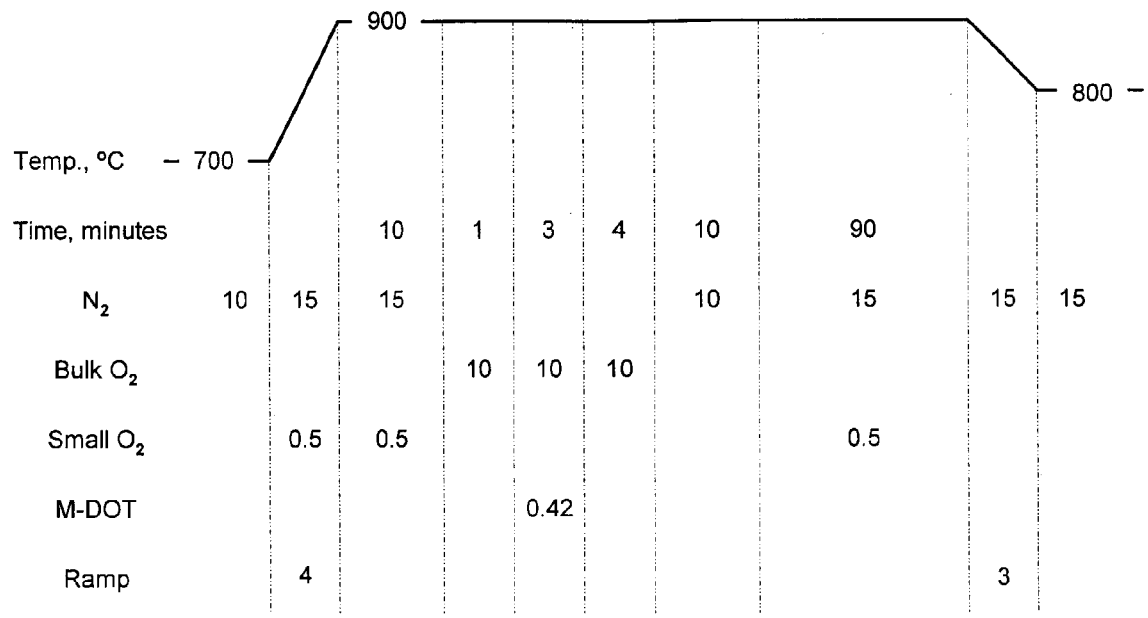
FIG. 3 is a diagram illustrating an exemplary protocol for a dry oxidation for forming a bottom oxide in a process according to the invention.
FIG. 4 is a diagram illustrating an exemplary protocol for a wet oxidation for a silicon nitride anneal in a process according to the invention.

The first oxide layer (bottom oxide) is preferably made using a dry oxidation process. In some embodiments the process includes heating the wafer; exposing the heated substrate to a mixture of $N_2$ and $O_2$ for a time; then exposing the heated substrate to $O_2$ for a time, during which it is exposed to Trans-1,2-Dichloroethylene ("Trans-LC"; also "M-DOT") for a short interval; then exposing the heated substrate to $N_2$ for a time and then to a mixture of $N_2$ and $O_2$ for a time, followed by cooling the wafer. An illustrative protocol is shown by way of example in FIG. 3. The silicon wafer is loaded into a furnace, such as a type TEL/AP ("Atmospheric Pressure") and brought to a temperature about 700° C., under $N_2$ flowing at a rate about 10 standard liters per minute ("slm"). Then the $N_2$ flow rate is increased to about 15 slm, and $O_2$ is introduced at a flow rate about 0.5 slm, as the temperature is ramped up at a rate about 5° C. per minute to about 900° C., where it is held until processing is complete and ramp down begins preparatory to unloading the wafer from the furnace. Once a temperature about 900° C. is reached, the wafer is held under $N_2$ at about 15 slm and $O_2$ at about 0.5 slm for about 10 minutes. Then the flow of $N_2$ and of $O_2$ is stopped, and $O_2$ is introduced at a flow rate about 10 slm for about 7 minutes and then the flow of $O_2$ is stopped. After the $O_2$ has been flowing for about 1 minute, Trans-LC is introduced at 0.42 slm for about 3 minutes, and then is shut off for the remaining about 4 minutes of the $O_2$ flow. After the $O_2$ flow is stopped, $N_2$ is again introduced at about 10 slm for about 10 minutes. Then $O_2$ is again introduced and the $N_2$ flow rate is increased, and the wafer is held for about 90 minutes under $N_2$ at about 15 slm and $O_2$ at about 0.5 slm. Then the $O_2$ flow is stopped and the wafer is held under $N_2$ at about 15 slm during ramp down at a rate about 3° C. per minute to a temperature about 800° C. Then the wafer is unloaded from the furnace under $N_2$ at a flow rate about 15 slm.

The thin silicon nitride layer is preferably formed by a low pressure chemical vapor deposition process. By way of illustration, the wafer is introduced to a furnace such as a type TEL LPCVD. Then the pressure is brought to 0.3 Torr and deposition is performed using $SiH_4$ as a deposition gas flowing at 0.28 liters per minute for about 15 minutes at about 620° C.

The wet silicon nitride anneal is preferably carried out at a temperature in a range about 800° C. to about 1000° C., exposing the heated wafer to a mixture of $N_2$ and $O_2$ for a time; then exposing the heated wafer to a mixture of $O_2$ and $H_2$ for a time. An illustrative protocol is shown by way of example in FIG. 4. A furnace, such as a type TEL/AP furnace, is held in "Mode 1" at a temperature about 800° C., under $N_2$ at a flow rate about 10 slm. (In Mode 1 the temperature is controlled by an external thermocouple.) Then the wafer is loaded into the furnace, the $N_2$ flow rate is increased to about 15 slm, and $O_2$ is introduced at a flow rate about 0.5 slm, as the temperature is ramped up at a rate about 5° C. per minute to a temperature about 1000° C. with the furnace switched to "Mode 3". (In Mode 3 the temperature is controlled by both an internal thermocouple and the external thermocouple, in a set ratio, such as 60% internal thermocouple: 40% external thermocouple.) Then the furnace is switched to "Mode 2" and is held in Mode 2 until processing is complete and ramp down begins preparatory to unloading the wafer from the furnace. (In Mode 2 the temperature is controlled by the internal thermocouple.) Once a temperature about 1000° C. is reached, the heater is switched on, and the flow of $N_2$ (at about 15 slm) and $O_2$ (at about 0.5 slm) is maintained for about 10 minutes. (The heater is associated particularly with the wafer.) Then the $N_2$ flow is stopped and the $O_2$ flow is increased to about 10 slm for about 5 minutes. Then the $O_2$ flow is slowed to about 6 slm and $H_2$ is introduced at a flow rate about 10 slm for about 6 minutes. Then the $H_2$ flow is stopped and the $O_2$ flow is increased to about 10 slm for about 10 minutes, after which the heater is switched off. Then the $O_2$ flow is stopped and $N_2$ is again introduced at a flow rate about 15 slm for about 10 minutes, followed by ramp down of the temperature at a rate about 3° C. per minute to a temperature about 800° C. under $N_2$ at about 15 slm with the furnace switched to Mode 3. Finally, the furnace is switched to Mode 1 and the wafer is unloaded under $N_2$ at about 15 slm.

The top oxide is preferably formed by high temperature low pressure chemical vapor deposition. By way of illustration, the wafer is introduced to a furnace such as a type TEL LPCVD furnace. Then the pressure is brought to about 0.35 Torr and deposition is performed using as a deposition gas a mixture of $N_2O$ flowing at 0.25 slm and $SiH_2Cl_2$ flowing at about 0.11 slm, for about 15 minutes at about 800° C.

EXAMPLES

Example 1

Figure 5:
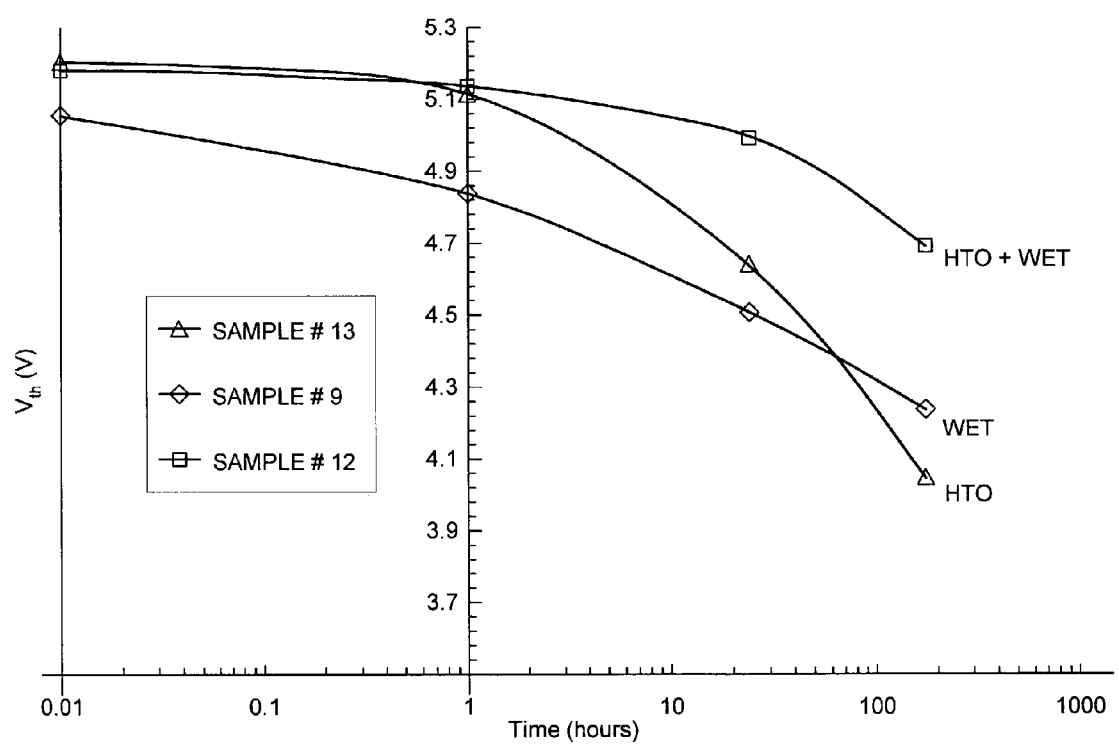
FIG. 5 is a plot of data showing superior sustained threshold voltage over extended baking times for memory cells according to the invention.

For this example, devices were made using three different processes, and the threshold voltages of the resulting devices were measured as they were subjected to extended baking times, exceeding 100 hours. For a first type of device (Sample #12) in this example, a wet oxidation was employed to anneal the silicon nitride and a high temperature LPCVD was employed to form the top oxide. For a second type of device (Sample #9) in this example a wet oxidation was employed to anneal the silicon nitride. For a third type of device (Sample #13) in this example a high temperature LPCVD was employed to form the top oxide, and then wet oxidation was employed for an additional short time to anneal the silicon nitride and high temperature oxide film. The results of one such thermal stress test are shown in FIG. 5. The devices made using a high temperature LPCVD to form the top oxide performed similarly over the first hour of the stress period, and better than the device in which the top oxide was formed in a conventional manner. The device made using both a high temperature LPCVD to form the top oxide and a wet oxidation to anneal the silicon nitride, according to the invention, maintained a satisfactorily high threshold voltage over a significantly greater time than did either of the other two devices in this test.

Other embodiments are within the following claims.

What is claimed is:

1. A method for making a silicon oxide/silicon nitride/silicon oxide structure comprises:
    forming a first silicon oxide layer over a substrate and
        forming a silicon nitride layer over the first oxide layer
        by chemical vapor deposition;

forming a second silicon oxide layer over the silicon nitride layer by high temperature low pressure chemical vapor deposition, the first silicon oxide layer and the silicon nitride layer and the second silicon oxide layer constituting a silicon oxide/silicon nitride/silicon oxide film;

performing a wet oxidation;

depositing a first gate layer over the second silicon oxide layer;

patterning the gate layer and the silicon oxide/silicon nitride/silicon oxide film to form a silicon oxide/silicon nitride/silicon oxide structure;

forming bit lines in the substrate adjacent the silicon oxide/silicon nitride/silicon oxide structure; and annealing to form a thermal oxide over the bit lines.

2. The method of claim 1 wherein forming the first silicon oxide layer comprises performing a dry oxidation of the substrate at a temperature in the range 700° C. to 900° C.

3. The method of claim 2 wherein performing the dry oxidation comprises using a flow of $O_2$ with $N_2$ as a carrier gas.

4. The method of claim 2 wherein forming the first silicon oxide layer results in a silicon oxide layer thickness about 30 Å to about 100 Å.

5. The method of claim 1 wherein forming the silicon nitride layer comprises performing a low pressure chemical vapor deposition.

6. The method of claim 5 wherein forming the silicon nitride layer results in a silicon nitride layer thickness about 30 Å to about 80 Å.

7. The method of claim 1 wherein performing the wet oxidation comprises performing a wet oxidation at a temperature in the range 800° C. to 1000° C.

8. The method of claim 7 wherein performing a wet oxidation comprises using a flow of $O_2$ and $H_2$ with a carrier gas.

9. The method of claim 1 wherein forming the second oxide layer by high temperature low pressure chemical vapor deposition comprises using a mixture of $N_2O$ and $SiH_2Cl_2$ as a deposition gas at a temperature about 800° C.

10. The method of claim 9 wherein forming the second silicon oxide layer results in a second silicon oxide layer thickness about 30 Å to about 150 Å.

11. The method of claim 1 wherein performing the wet oxidation is performed following forming the second silicon oxide layer, and results in annealing the silicon nitride layer and the second silicon oxide layer.

* * * * *